United States Patent
Huang et al.

(10) Patent No.: US 9,426,893 B2
(45) Date of Patent: Aug. 23, 2016

(54) CURVED CAPACITIVE TOUCH PANEL AND MANUFACTURE METHOD THEREOF

(75) Inventors: Jun-Yao Huang, Miaoli County (TW); Po-Pin Hung, Jingmen County (TW)

(73) Assignee: TPK Touch Solutions Inc., Taipei (TW)

( * ) Notice: Subject to any disclaimer, the term of this patent is extended or adjusted under 35 U.S.C. 154(b) by 1315 days.

(21) Appl. No.: 12/509,435

(22) Filed: Jul. 24, 2009

(65) Prior Publication Data

US 2010/0103138 A1 Apr. 29, 2010

(30) Foreign Application Priority Data

Oct. 27, 2008 (TW) ................ 97141165 A

(51) Int. Cl.
  *G06F 3/045* (2006.01)
  *G06F 3/041* (2006.01)
  *H05K 3/00* (2006.01)
  *G06F 3/044* (2006.01)

(52) U.S. Cl.
  CPC .............. *H05K 3/0058* (2013.01); *G06F 3/044* (2013.01); *H05K 3/0014* (2013.01); *H05K 3/0067* (2013.01); *G06F 3/041* (2013.01); *G06F 3/045* (2013.01); *G06F 2203/04103* (2013.01); *H05K 2201/0129* (2013.01); *H05K 2201/09018* (2013.01); *H05K 2203/068* (2013.01); *H05K 2203/1105* (2013.01); *H05K 2203/302* (2013.01); *Y10T 29/49124* (2015.01)

(58) Field of Classification Search
  CPC ......... G06F 3/041; G06F 3/045; G06F 3/044; G06F 2203/04103; B60K 7/06; H05K 2203/068; H05K 2203/1105; H05K 2203/302; H05K 3/0058; H05K 3/0014; H05K 3/0067; H05K 2201/0129; H05K 2201/09018; Y10T 29/49124

USPC ....................... 345/173–174, 156, 55, 104, 87
See application file for complete search history.

(56) References Cited

U.S. PATENT DOCUMENTS

| | | | |
|---|---|---|---|
| 6,654,071 | B2 | 11/2003 | Chen |
| 2003/0095111 | A1* | 5/2003 | Song et al. ................. 345/173 |
| 2005/0117197 | A1* | 6/2005 | Ide ............................. 359/291 |
| 2006/0007171 | A1* | 1/2006 | Burdi et al. ................ 345/173 |
| 2006/0197753 | A1* | 9/2006 | Hotelling ................... 345/173 |
| 2008/0042997 | A1* | 2/2008 | Endo .......................... 345/176 |
| 2008/0226375 | A1* | 9/2008 | Hsu ............................ 400/490 |
| 2009/0085892 | A1* | 4/2009 | Ishikura et al. ........... 345/174 |
| 2009/0179862 | A1* | 7/2009 | Strong, IV ................ 345/169 |
| 2009/0277578 | A1* | 11/2009 | Sung et al. ................ 156/285 |

FOREIGN PATENT DOCUMENTS

| | | |
|---|---|---|
| CN | 1523422 A | 8/2004 |
| CN | 1612185 A | 5/2005 |
| GB | 1110377 A | 4/1968 |
| JP | 2001-154592 A | 6/2001 |
| JP | 2002341323 A | 11/2002 |
| WO | WO2007099733 A1 | 9/2007 |

* cited by examiner

*Primary Examiner* — Lun-Yi Lao
*Assistant Examiner* — Jarurat Suteerawongsa
(74) *Attorney, Agent, or Firm* — Gokalp Bayramoglu

(57) ABSTRACT

A manufacture method and structure of a curved capacitive touch panel is disclosed. A flat flexible printed circuit board (FPCB) with capacitive touch sensing/detecting capability is provided, followed by subjecting the flat FPCB to compressing molding to form a curved FPCB. Subsequently, a curved substrate is provided, wherein an outer curved surface of the curved FPCB is bonded to an inner curved surface of the substrate, thereby forming the curved capacitive touch panel.

18 Claims, 15 Drawing Sheets

US 9,426,893 B2

CURVED CAPACITIVE TOUCH PANEL AND MANUFACTURE METHOD THEREOF

CROSS-REFERENCE TO RELATED APPLICATIONS

The entire contents of Taiwan Patent Application No. 097141165, filed on Oct. 27, 2008, from which this application claims priority, are incorporated herein by reference.

BACKGROUND OF THE INVENTION

1. Field of the Invention

The present invention generally relates to a manufacture method and structure of a curved capacitive touch panel, and more particularly to a method of molding a capacitive touch panel with curved shape, and a touch panel manufactured based on the method.

2. Description of the Related Art

Resistive and capacitive touch panels are two common types of touch panel technologies. The capacitive touch panel usually includes a touch panel circuit, which is manufactured by stacking a number of transparent conductive materials (such as indium tin oxide (ITO)) on a transparent substrate using a photolithography technique such as exposure, developing and etching, thereby resulting in a transparent capacitive touch panel. The touch panel circuit may alternatively include a flexible printed circuit board (FPCB), which is attached to the substrate, thereby resulting in an opaque capacitive touch panel. A touch on the touch panel results in a capacitance effect between the touch panel circuit and human body, and the touch position may then be accordingly detected.

As curved surfaces are the latest design trend of optoelectronic products, conventional physical keys or art lines thus cannot readily be in harmony with the curved surfaces of such designs and may add complexity in manufacture. The curved surfaces in the opto-electronic products are discussed, for example, in UK Patent No. 1110377, Japan Patent Publication No. 2002341323, China Patent Publication No. 1612185 and the curved liquid crystal display (LCD) announced by AU Optronics Corp. in June 2008. However, that literatures concerns the application of the curved surface in safety glass or LCD, rather than in touch panel devices.

For the foregoing, a curved touch panel is disclosed, for example, in U.S. Pat. No. 6,654,071, which discloses a flexible capacitive touch panel that is capable of being bent and thus conforming to the curved surface of a display, and is then attached to the display to form a display with touch sensing/detecting capability. China Patent Publication No. 1479891 provides a curved capacitive touch pad, which includes a film inserted between two transparent rigid curved plates. The touch panel in U.S. Pat. No. 6,654,071 and the touch pad in China Patent Publication No. 1479891, however, are bent along only one axial direction, such as the vertical axis or the horizontal axis of the touch panel. Moreover, no manufacturing details have been disclosed in the publications.

In order to overcome these problems, US Patent Publication No. 20080042997 discloses a curved resistive touch panel, which is manufactured by firstly attaching a flat polarization plate to a touch panel, and then pressing the composite polarization plate/touch panel into a curved shape. According to this manufacture method, the polarization plate and the touch panel may end up being discarded as wasted material whenever the pressing step fails. Further, the portion with lower stress intensity in the composite polarization plate/touch panel may fracture partially or result in interference fringes during the pressing step.

Furthermore, due to better transmittance and resistance to scratch, wear and deform, glass is preferably used as the composing material for the substrate rather than plastic (e.g., polyethylene terephthalate or PET). High temperature (e.g. 650-750° C.) is required to bend the glass substrate to form a curved glass substrate. However, the FPCB may crack at 300° C. Therefore, the FPCB and the flat glass substrate unfortunately cannot be made curved at the same time.

SUMMARY OF THE INVENTION

In view of the foregoing, embodiments of the present invention provide a manufacture method and a structure of a curved capacitive touch panel, particularly made of thermoplastic material that is thermally extendable.

According to a method of forming the curved capacitive touch panel, a flat flexible printed circuit board (FPCB) with capacitive touch sensing/detecting capability is provided, followed by subjecting the flat FPCB to compressing molding in order to form a curved FPCB. Subsequently, a curved substrate is provided, wherein an outer curved surface of the curved FPCB is bonded to an inner curved surface of the substrate, thereby forming the curved capacitive touch panel.

According to a structure of the curved capacitive touch panel, the touch panel includes a three-dimensional curved flexible printed circuit board (FPCB) with capacitive touch sensing/detecting capability, wherein a first curved sidewall and a first curved endwall are respectively formed by compression molding along at least two axial directions. The touch panel also includes a touchable three-dimensional curved substrate having a second curved sidewall bonded with the first curved sidewall, and a second curved endwall bonded with the first curved endwall.

BRIEF DESCRIPTION OF THE DRAWINGS

Many aspects of the present structure and manufacture method can be better understood with reference to the following drawings. The components in the drawings are not necessarily to scale, emphasis instead being placed upon clearly illustrating the principles of the present disclosures. Moreover, in the drawings, like reference numerals designate corresponding parts throughout the several views.

FIG. 2A through FIG. 8 are cross-sectional views illustrating a method of forming a curved capacitive touch panel of the first embodiment, in which FIG. 2A is a cross-sectional view showing that a flat FPCB is placed in a mold cavity;

FIG. 4 is a cross-sectional view showing that superfluous edges are removed with a cutting tool;

FIG. 5 is a cross-sectional view showing that a printing roller prints on the inner curved surface of the curved glass substrate;

FIG. 6 is a cross-sectional view showing that a coating roller coats an adhesive layer on the inner curved surface of the curved glass substrate;

FIG. 7 is a cross-sectional view showing that the curved FPCB is bonded and thus attached to the curved glass substrate;

FIG. 8 is a cross-sectional view showing the resultant curved capacitive touch panel;

FIG. 9 through FIG. 13 are cross-sectional views, taken on a plane perpendicular to and along a transverse direction of a FPCB, illustrating a method of forming a curved capacitive touch panel according to a second embodiment of the present invention, in which FIG. 9 is a cross-sectional view showing that a flat FPCB is placed in a mold cavity;

FIG. 10 is a cross-sectional view showing that the flat FPCB is bent into a curved FPCB due to the heat and pressure of the positive mold and the negative mold;

FIG. 11 is a cross-sectional view showing that superfluous edges are removed with a cutting tool;

FIG. 12 is a cross-sectional view showing that the curved FPCB is bonded and thus attached to the curved glass substrate;

FIG. 13 is a cross-sectional view showing the resultant curved capacitive touch panel;

FIG. 14 through FIG. 20 illustrate a method of forming a curved capacitive touch panel according to a third embodiment of the present invention, in which FIG. 14 is an exploded view showing that a flat FPCB is placed in a mold cavity;

FIG. 15 is a cross-sectional view showing that a flat FPCB is placed in a mold cavity;

FIG. 16 is an exploded view showing that the flat FPCB is bent into a curved FPCB due to the heat and pressure of the positive mold and the negative mold;

FIG. 17 is a cross-sectional view showing that the flat FPCB is bent into a curved FPCB due to the heat and pressure of the positive mold and the negative mold;

FIG. 18 is a cross-sectional view showing that superfluous edges are removed with a cutting tool;

FIG. 19 is a cross-sectional view showing the resultant curved capacitive touch panel;

FIG. 20 is an exploded view showing the resultant curved capacitive touch panel;

DETAILED DESCRIPTION OF THE INVENTION

First Embodiment

Figure 1:
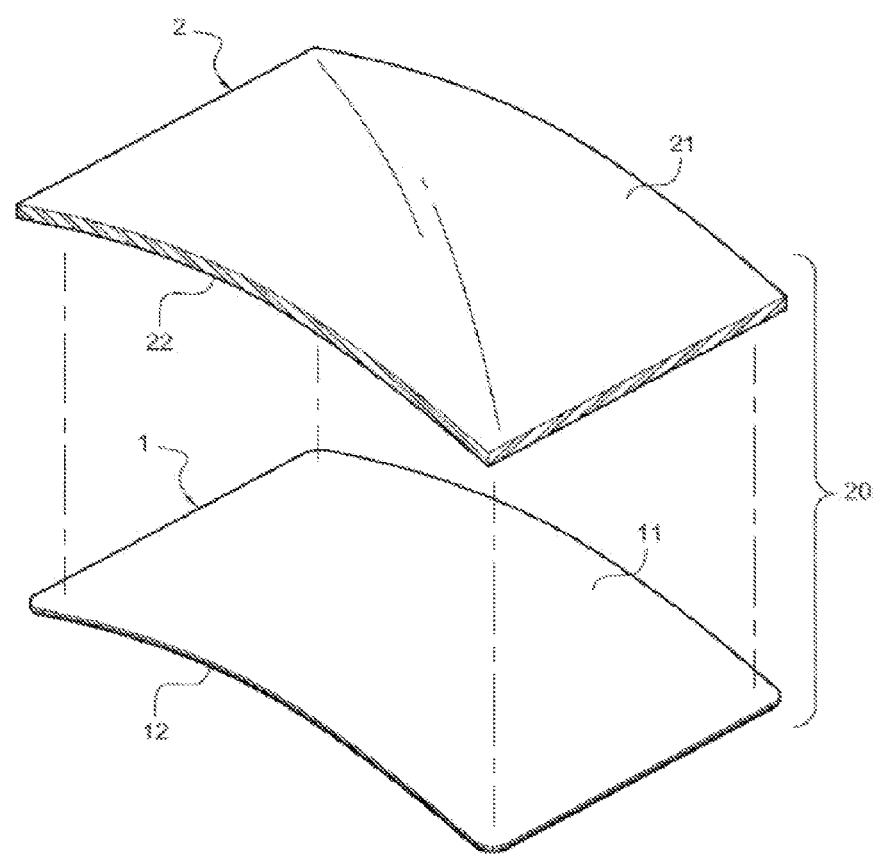
FIG. 1 is an exploded view of a curved capacitive touch panel according to a first embodiment of the present invention.

FIG. 1 is an exploded view of a curved capacitive touch panel according to a first embodiment of the present invention. FIG. 2A through FIG. 8 are cross-sectional views illustrating a method of forming a curved capacitive touch panel of the first embodiment.

Referring to FIG. 1, a curved capacitive touch panel 20 according to the first embodiment is illustrated. The curved capacitive touch panel 20 includes a curved glass substrate 2 and a curved flexible printed circuit board (FPCB) 1. The curved glass substrate 2 has an outer curved surface 21 and an inner curved surface 22, and the curved FPCB 1 has an outer curved surface 11 and an inner curved surface 12. The outer curved surface 11 of the curved FPCB 1 is bonded and attached to the inner curved surface 22 of the curved glass substrate 2.

Also referring to FIGS. 2A-8, a manufacture method for forming the curved capacitive touch panel includes the following steps (1) to (7).

Figure 2A:
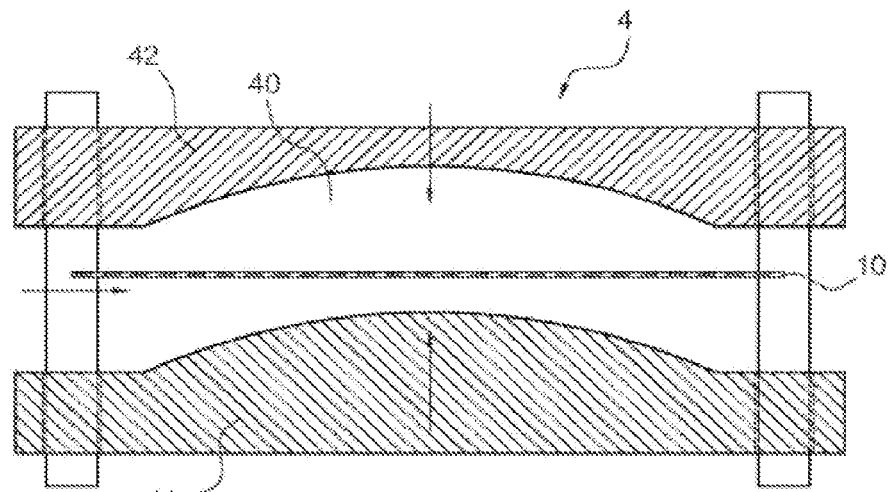

Step (1) As shown in FIG. 2A, a flat flexible printed circuit board (FPCB) 10 is provided.

Figure 2B:
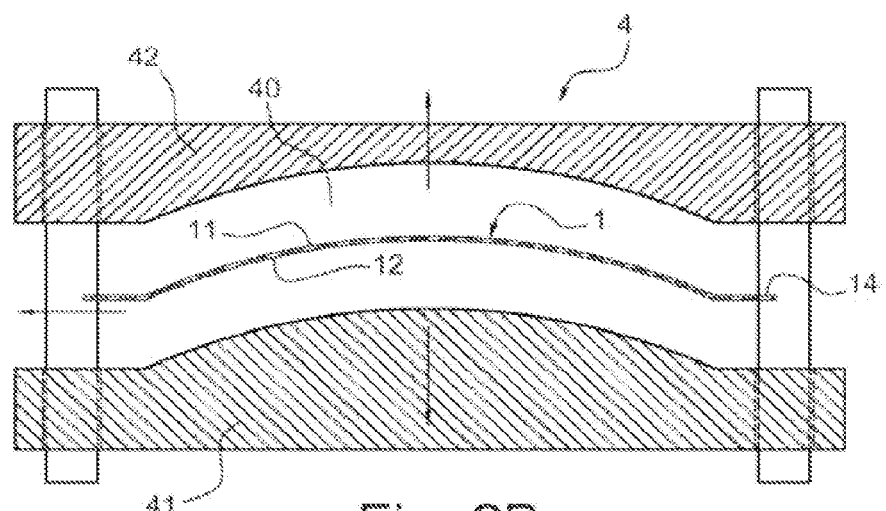
FIG. 2B is a cross-sectional view showing that the flat FPCB is bent into a curved FPCB due to the heat and pressure of the positive mold and the negative mold.

Step (2) Referring to FIG. 2A and FIG. 2B, the flat FPCB 10 is subjected to compression molding in order to form a curved FPCB 1. In the embodiment, the flat FPCB 10 is placed between a positive mold 41 and a negative mold 42 in a mold cavity 40 of heated compression molding equipment 4. The positive mold 41 and the negative mold 42 are preheated to a predetermined temperature (e.g., about 200-250° C.), at which the thermoplastic composition of the FPCB 10 may be set. Due to the heat and pressure of the positive mold 41 and the negative mold 42, the flat FPCB 10 may be bent into the curved FPCB 1 (FIG. 2B) that is bending along an axial direction and has an outer curved surface 11 and an inner curved surface 12 of a two-dimensional curve. In the embodiment, the bending axial direction may be the vertical axis. Further, the curved FPCB 1 usually possesses superfluous edges 14 along the edges of the curved FPCB 1 after the compression molding.

Figure 4:
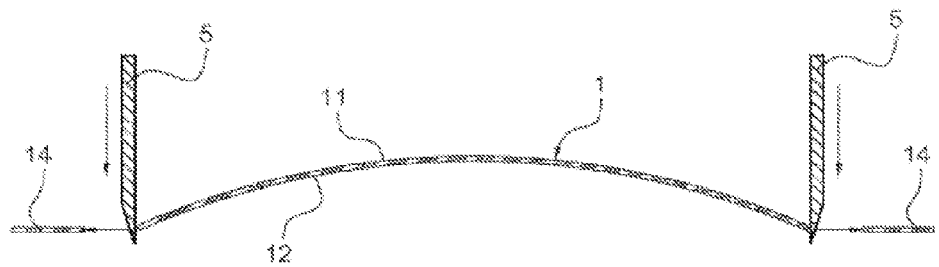

Step (3) Referring to FIG. 4, the superfluous edges 14 may be removed or cut respectively with a cutting tool 5, such as a cutting blade.

Figure 5:
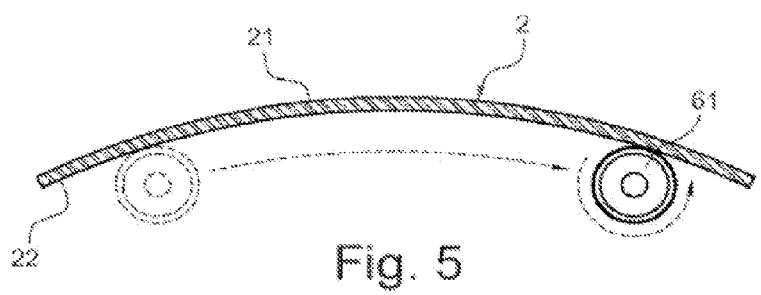

Step (4) Referring to FIG. 5, a two-dimensional curved glass substrate 2 is provided by using casting or heated compression molding technique. The curved glass substrate 2, which is either transparent or opaque, has a touchable outer curved surface 21 and an inner curved surface 22.

Step (5) Still referring to FIG. 5, a printing roller 61 is used to print patterns (e.g., virtual keys), characters or symbols, which may shield corresponding portions of the curved FPCB 1, on the inner curved surface 22 of the curved glass substrate 2. Accordingly, the physical keys or art lines set on conventional touch panel products may be omitted, thereby facilitating curved surface design for the products.

Figure 6:
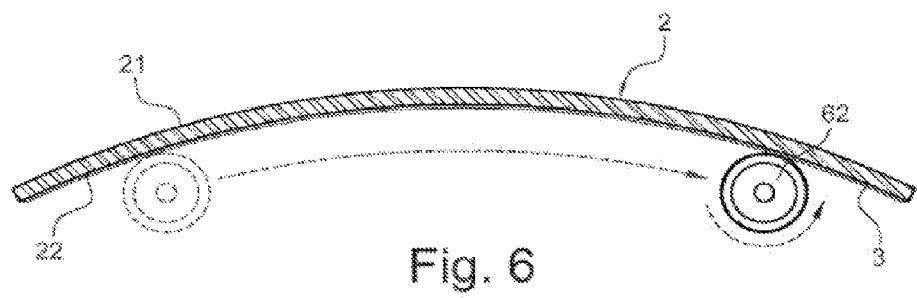

Step (6) Referring to FIG. 6, a coating roller 62 is used to coat an adhesive layer 3 on the printed patterns, characters or symbols of the inner curved surface 22 of the curved glass substrate 2. In the embodiment, the adhesive layer 3 may be made of pressure-sensitive adhesive, optical sensitive adhesive or thermal-sensitive adhesive.

Figure 7:
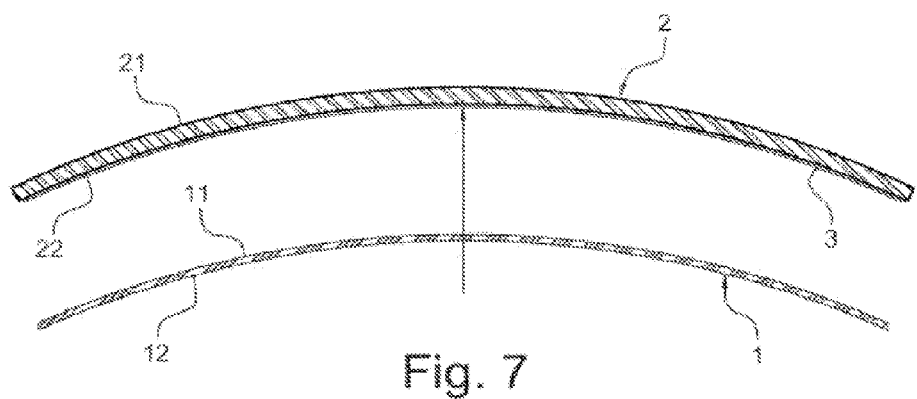
Figure 8:
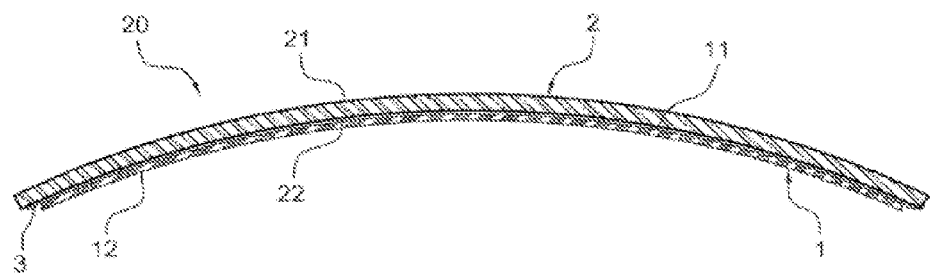
Figure 9:
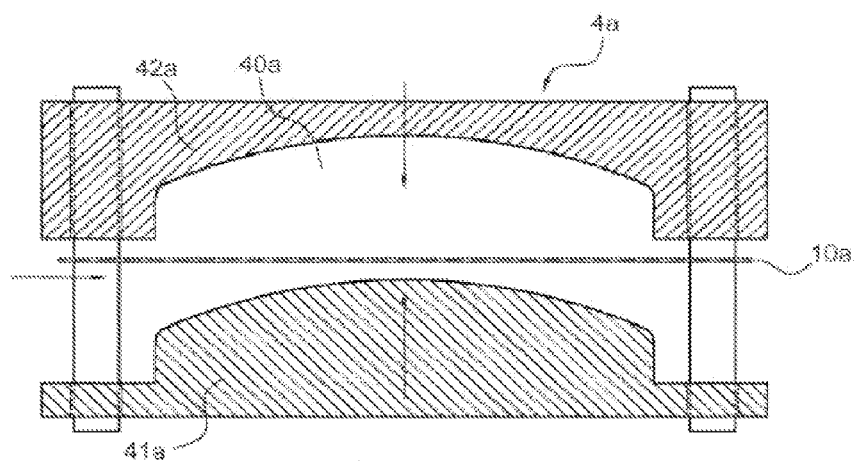
Figure 10:
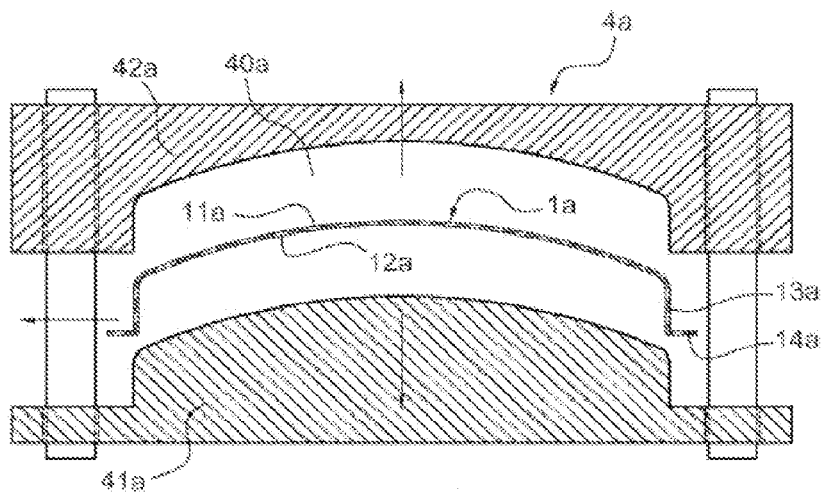

Step (7) Referring to FIGS. 7-8 and FIG. 1, the outer curved surface 11 of the curved FPCB 1 is bonded and thus attached to the inner curved surface 22 of the curved glass substrate 2 (FIG. 8) via the adhesive layer 3, thereby resulting in a two-dimensional curved capacitive touch panel 20.

According to the present embodiment, the flat FPCB 10 is bent with heat and compression due to its thermoplastic characteristic along an axial direction to form the two-dimensional curved FPCB 1, which is then attached to the curved glass substrate 2 to result in the two-dimensional curved capacitive touch panel 20.

Figure 3A:
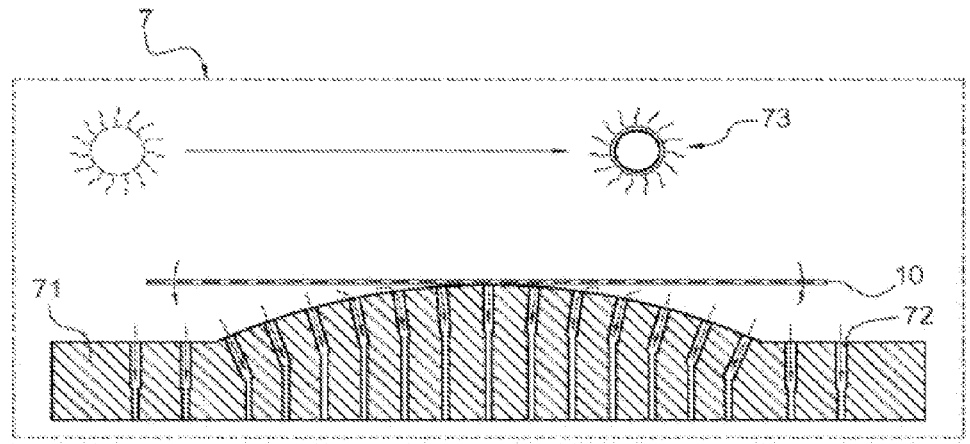
FIG. 3A is a cross-sectional view showing that a flat FPCB is placed in vacuum-assisted cold pressing equipment.
Figure 3B:
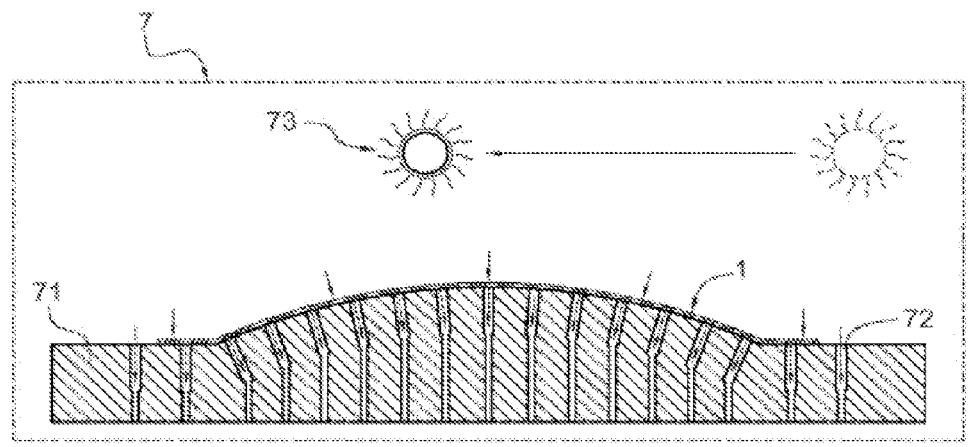
FIG. 3B is a cross-sectional view showing that the flat FPCB is bent into a curved FPCB due to vacuum force and a heater.

The compression molding described above may be replaced with a vacuum-assisted cold pressing technique as shown in FIG. 3A and FIG. 3B. The flat FPCB 10 is placed on a positive mold 71 of vacuum-assisted cold pressing equipment 7. On the surface of the positive mold 71 are air holes 72, and above the positive mold 71 is a heater 73. The interior of the vacuum-assisted cold pressing equipment 7 is vacuumed, and the FPCB 10 is thus attached on the surface of the positive mold 71 owing to the drawing of the air holes 72. The heater 73 evenly provides heat to the FPCB 10, and the flat FPCB 10 thus may be bent into a two-dimensional curved FPCB 1 (FIG. 3B) that is bending along an axial direction. Other steps are similar to those described in FIGS. 1-8.

In the embodiment, the touch panel 20 may be integrated onto a surface of a display panel, an electronic device or equipment, such that the inner curved surface 12 of the curved FPCB 1 contacts the surface of the display panel, the electronic device or equipment, or covers the inner electronic components of the display panel, the electronic device or equipment. A touch on the outer curved surface 21 of the glass substrate 2 of the touch panel 20 results in capacitance effect between the curved FPCB 1 and human body, and the touch position on the glass substrate 2 may accordingly be detected.

Second Embodiment

Figure 11:
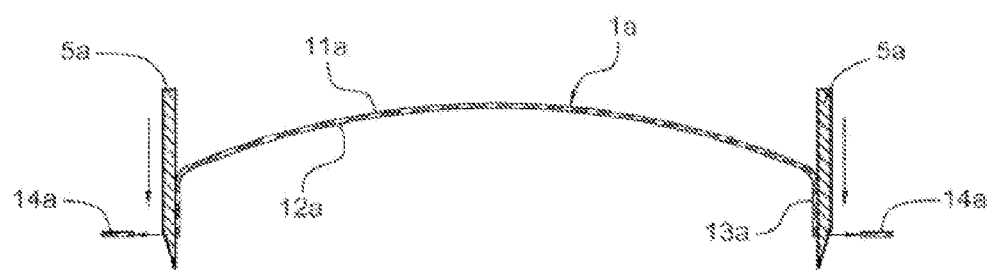
Figure 12:
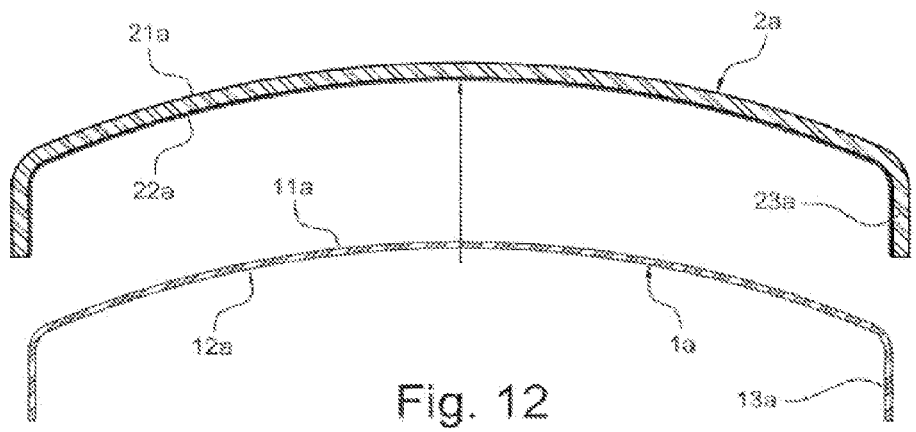
Figure 13:
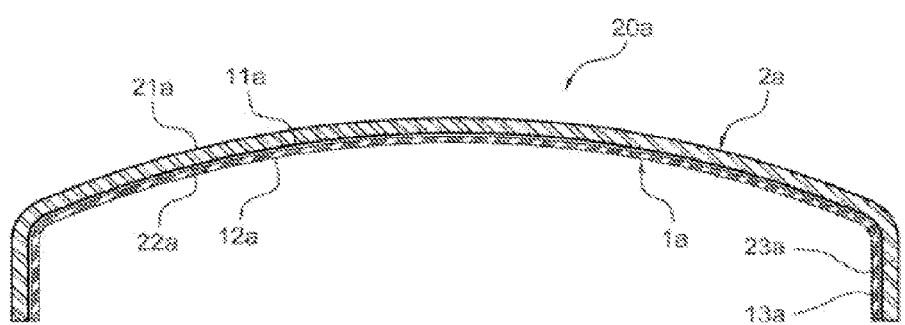

FIG. 9 through FIG. 13 are cross-sectional views, taken on a plane perpendicular to and along a transverse direction of a FPCB, illustrating a method of forming a curved capacitive touch panel according to a second embodiment of the present invention. A flat FPCB 10a is placed between a positive mold 41a and a negative mold 42a in a mold cavity 40a of heated compression molding equipment 4a. Due to the heat and pressure of the positive mold 41a and the negative mold 42a, the flat FPCB 10a may be bent into a curved FPCB 1a (FIG. 10) that is bending along an axial direction and has an outer curved surface 11a and an inner curved surface 12a of a two-dimensional curve. In the embodiment, the bending axial direction may be the vertical axis. Moreover, the curved FPCB 1a has a curved sidewall 13a, which usually possesses superfluous edges 14a, which may then be cut with a cutting tool 5a (FIG. 11).

Subsequently, a two-dimensional curved glass substrate 2a (FIG. 12) is provided. The curved glass substrate 2a has a touchable outer curved surface 21a and an inner curved surface 22a, and has a corresponding curved sidewall 23a. The outer curved surface 11a of the curved FPCB 1a is bonded and thus attached to the inner curved surface 22a of the curved glass substrate 2a (FIG. 13), and the curved sidewall 13a of the curved FPCB 1a is attached to the curved sidewall 23a of the curved glass substrate 2a, thereby resulting in a two-dimensional curved capacitive touch panel 20a. Other steps are similar to those described in FIGS. 1-8.

According to the present embodiment, the flat FPCB 10a is bent with heat and compression due to its thermoplastic characteristic along an axial direction to form the two-dimensional curved FPCB 1a, which is then attached to the curved glass substrate 2a to result in the two-dimensional curved capacitive touch panel 20a. The curved capacitive touch panel 20a, in the embodiment, further includes the curved sidewall 23a, which substantially increases overall touch sensing/detecting capability, and considerably facilitates design versatility.

Third Embodiment

Figure 19:
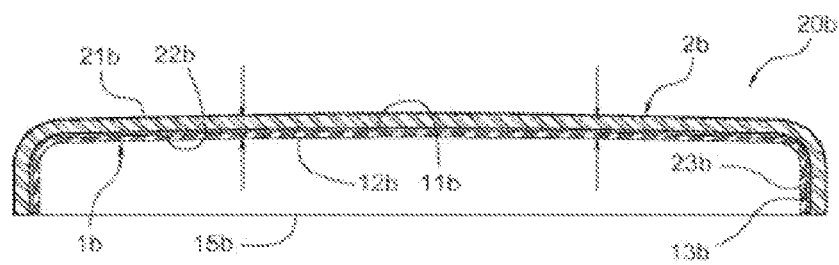
Figure 20:
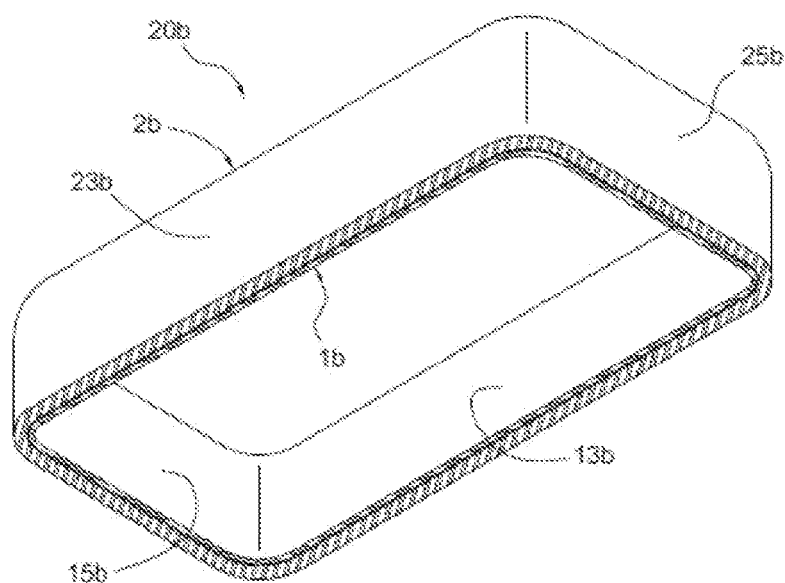
Figure 21A:
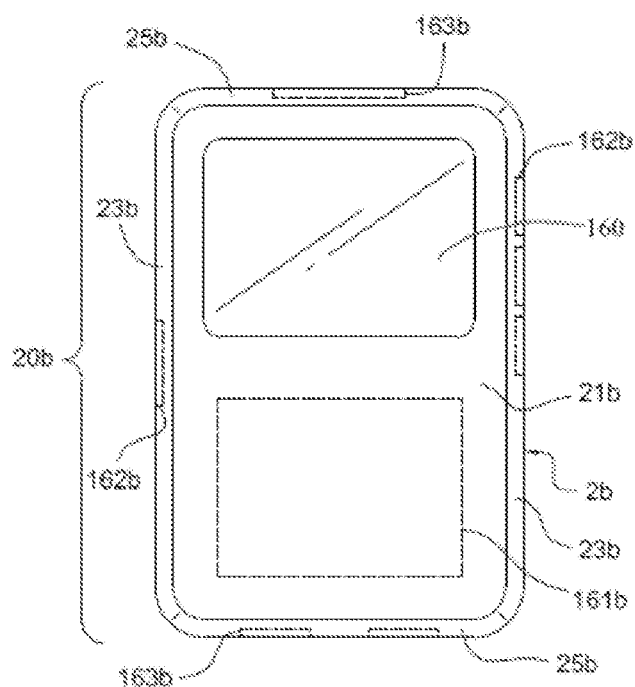
FIG. 21A is a front view according to the embodiment depicted in FIG. 20.
Figure 21B:
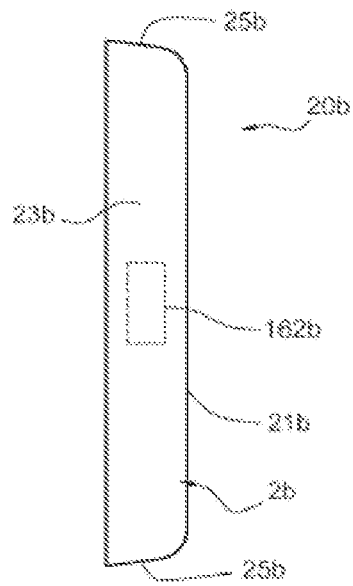
FIG. 21B is a left view of FIG. 21A.
Figure 21C:
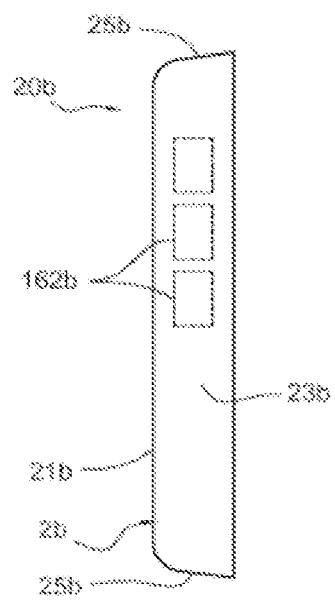
FIG. 21C is a right view of FIG. 21A.
Figure 21D:
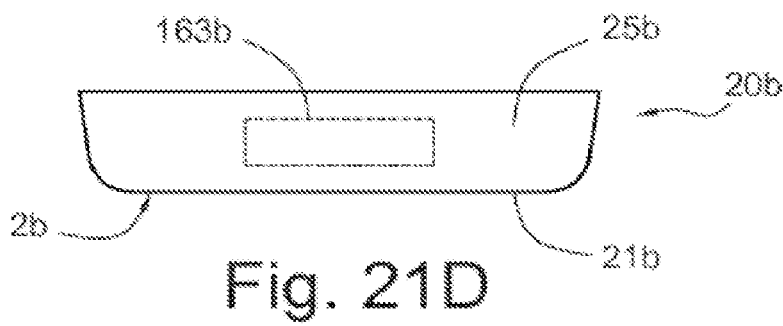
FIG. 21D is a top view of FIG. 21A.
Figure 21E:
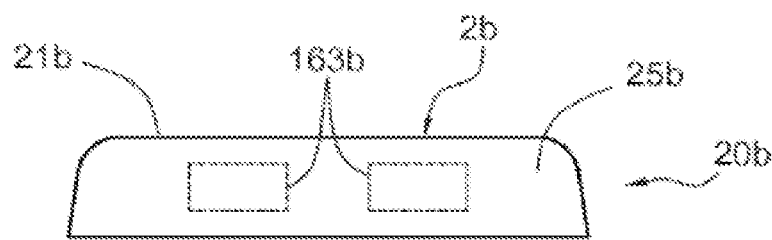
FIG. 21E is a bottom view of FIG. 21A.

FIG. 19 and FIG. 20 are cross-sectional views of a three-dimensional curved capacitive touch panel 20b according to a third embodiment of the present invention. The curved capacitive touch panel 20b includes a three-dimensional curved FPCB 1b and a touchable three-dimensional curved glass substrate 2b. Specifically, the curved FPCB 1b has capacitive touch sensing/detecting capability, and is bent along at least two axial directions to form one or more first curved sidewalls 13b and one or more first curved endwalls 15b. In the embodiment, the axial directions may be the vertical axis and the horizontal axis. The glass substrate 2b has corresponding second curved sidewall(s) 23b and second curved endwall(s) 25b.

Furthermore, the curved FPCB 1b has an outer curved surface 11b, which corresponds to an inner curved surface 22b of the glass substrate 2b. Accordingly, the outer curved surface 11b may be bonded and thus attached to the inner curved surface 22a, the first curved sidewall 13b may be attached to the second curved sidewall 23b, and the first curved endwall 15b may be attached to the second curved endwall 25b. Other steps, such as pattern printing and adhesive layer coating, are similar to the embodiments described above.

Figure 14:
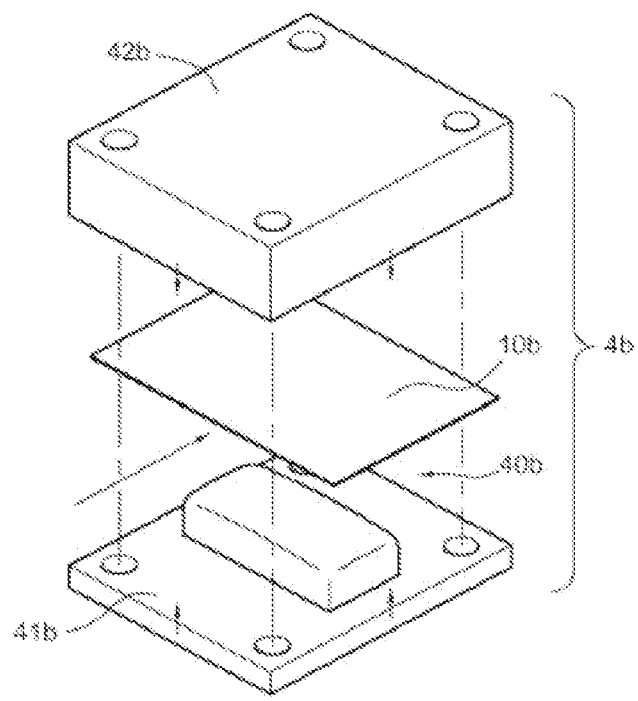
Figure 15:
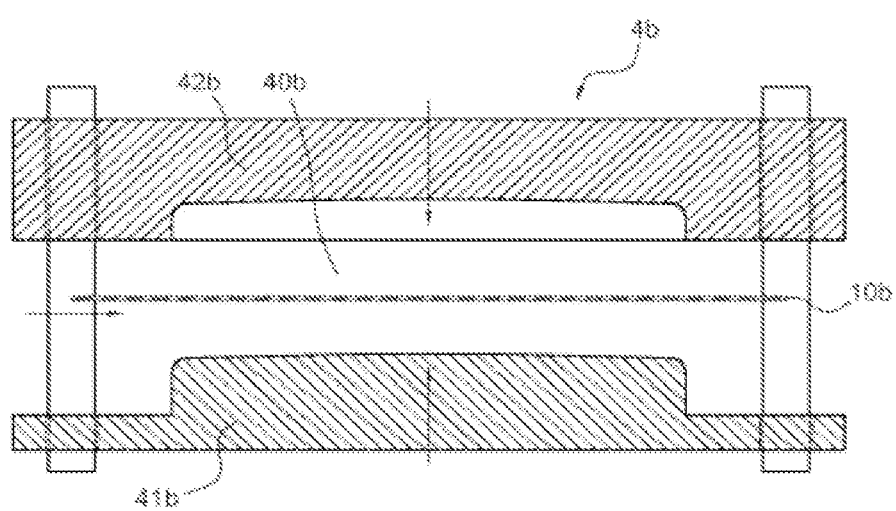
Figure 16:
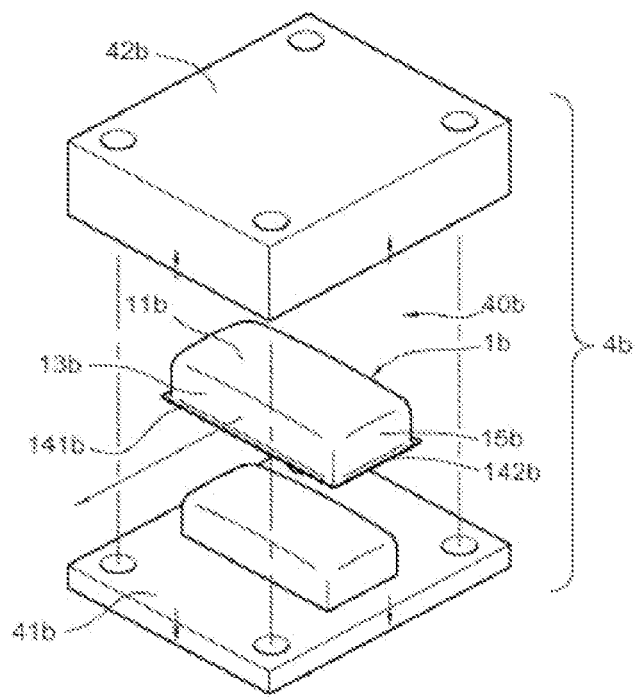
Figure 17:
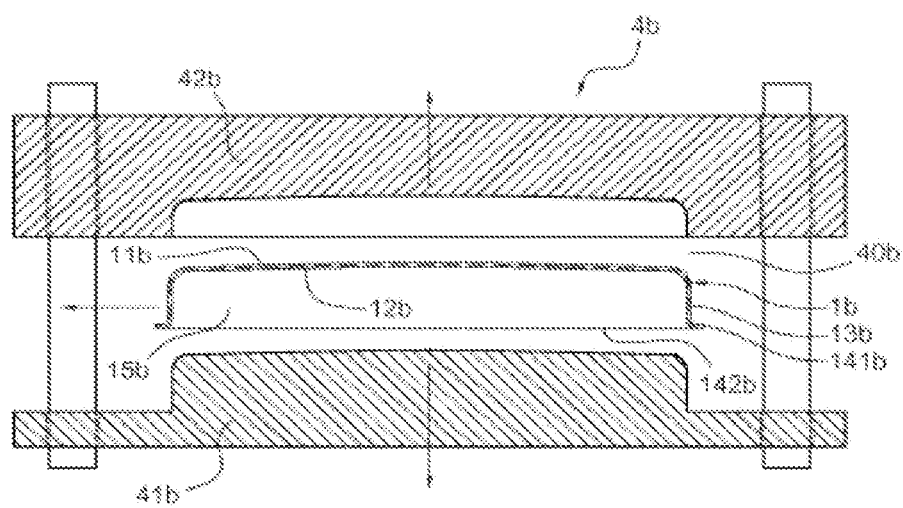
Figure 18:
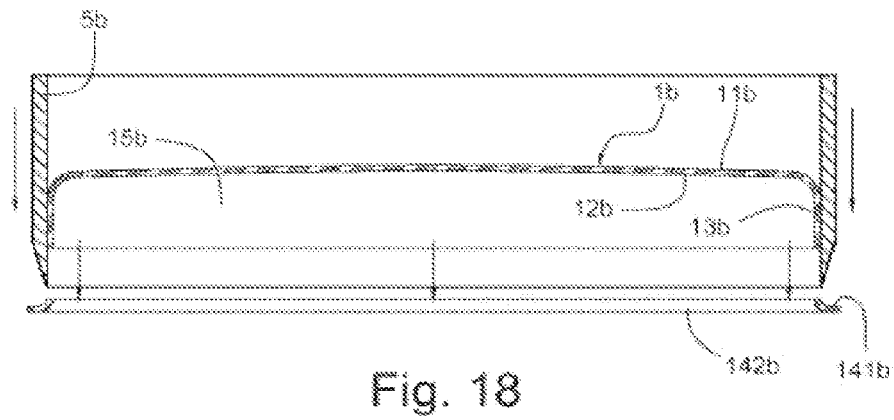

FIG. 14 through FIG. 19 illustrate a method of forming a curved capacitive touch panel according to the third embodiment of the present invention. A flat FPCB 10b is placed between a positive mold 41b and a negative mold 42b in a mold cavity 40b of heated compression molding equipment 4b (FIGS. 14-15). Due to the heat and pressure of the positive mold 41b and the negative mold 42b, the flat FPCB 10b may be bent into a curved FPCB 1b (FIGS. 16-17) that is bending along two axial directions. As a result, the curved FPCB 1b has an outer curved surface 11b and an inner curved surface 12b. At the two sides of the curved FPCB 1b are the first curved sidewalls 13b, and at the two ends of the curved FPCB 1b are the first curved endwalls 15b. The first curved sidewalls 13b and the first curved endwalls 15b usually possess superfluous edges 141b and 142b, respectively, which may then be cut with a cutting tool 5b (FIG. 18).

Subsequently, a three-dimensional curved glass substrate 2b (FIG. 19) is provided. The curved glass substrate 2b has a touchable outer curved surface 21b and an inner curved surface 22b, and has corresponding second curved sidewalls 23b at two sides, and corresponding second curved endwalls 25b at two ends (FIG. 20).

Accordingly, the outer curved surface 11b of the curved FPCB 1b is bonded and thus attached to the inner curved surface 22b of the curved glass substrate 2b (FIG. 13), the first curved sidewalls 13b is bonded and thus attached to the second curved sidewalls 23b, and the first curved endwalls 15b is bonded and thus attached to the second curved endwalls 25b, thereby resulting in a three-dimensional curved capacitive touch panel 20b. Other steps are similar to those of the embodiments described above.

Referring to FIGS. 19-21E, touch areas 161b, 162b, and 163b are formed, respectively, on the outer curved surface 21h, the second curved sidewall 23b, and the second curved endwall 25b (FIGS. 21A-21E), Those touch areas are used as virtual keys that replace the physical keys of the conventional touch panel products. Furthermore, the curved capacitive touch panel, as shown in FIG. 21A, has a display area 160.

Compared to the conventional flat touch panel, the three-dimensional capacitive touch panel 20b thus formed additionally possesses two touchable curved sidewalls 23b and two touchable curved endwalls 25b, thereby forming a capacitive touch panel 20b with totally five faces with touch area(s), which substantially increase use convenience and considerably facilitate design versatility (e.g., eliminating the art lines).

According to the embodiments described above, the inner curved surface 22/22a/22b of the glass substrate 2/2a/2b is an inner concave surface (FIG. 8/13/19), and the outer curved surface 11/11a/11b of the curved FPCB 1/1a/1b is an outer convex surface. The inner concave surface of the glass substrate 2/2a/2b is bonded and attached to the outer convex surface of the curved FPCB 1/1a/1b, thereby resulting in a two-dimensional curved capacitive touch panel.

Figure 22:
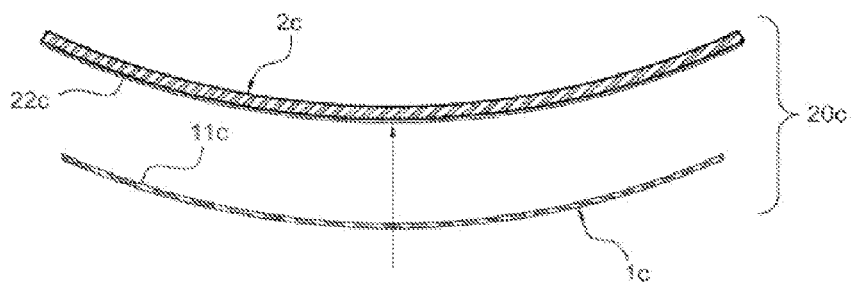
FIG. 22 shows another embodiment of the present invention.

FIG. 22 shows another embodiment of the present invention, in which the inner curve surface 22c of the glass substrate 2c is an inner convex surface, and the outer curve surface 11c of the curved FPCB 1c is an outer concave surface. The inner convex surface of the glass substrate 2c is bonded and attached to the outer concave surface of the curved FPCB 1c, thereby resulting in a two-dimensional curved capacitive touch panel 20c.

Although specific embodiments have been illustrated and described, it will be appreciated by those skilled in the art that various modifications may be made without departing from the scope of the present invention, which is intended to be limited solely by the appended claims.

What is claimed is:

1. A method of forming a curved capacitive touch panel, comprising:
providing a curved glass substrate;
providing a flat flexible printed circuit board (FPCB) with at least one of capacitive touch sensing and detecting capability;
bending the flat FPCB along at least an axial direction to form at least a two-dimensional curved FPCB;
wherein the at least two-dimensional curved FPCB respectively comprise curved sidewalls;
upon formation of the curved FPCB, aligning the curved FPCB to the curved glass substrate; and
bonding an outer curved surface of the curved FPCB to an inner curved surface of the curved glass substrate, thereby forming the curved capacitive touch panel having a display area and at least one touch-sensing area, wherein the display area and the touch-sensing area are separately distributed on the area of the curved glass substrate, and
at least another touch-sensing area distributed on the curved sidewalls;
wherein the curved capacitive touch panel performs as an outer case for containing an electronic device, and a display panel of the electronic device is aligned to the display area, wherein the touch position is detected when a touch on the touch-sensing area results in capacitance effect.

2. The method of claim 1, wherein the flat FPCB is bent in a heated compression molding or a vacuum-assisted cold pressing equipment.

3. The method of claim 1, wherein the flat. FPCB is bent along two axial directions to form a three-dimensional curved FPCB.

4. The method of claim 3, wherein two sides of the three-dimensional curved FPCB respectively comprise curved sidewalls, and two ends of the three-dimensional curved FPCB respectively comprise curved endwalls.

5. The method of claim 1, further comprising removing superfluous edges of the curved FPCB.

6. The method of claim 1, wherein the curved glass substrate comprises transparent glass.

7. The method of claim 1, further comprising printing patterns, characters or symbols on an inner curved surface of the curved glass substrate, for shielding corresponding portions of the curved FPCB.

8. The method of claim 1, further comprising coating an adhesive layer on an inner curved surface of the glass substrate for facilitating attaching an outer curved surface of the curved FPCB to the inner curved surface of the glass substrate.

9. The method of claim 8, wherein the adhesive layer comprises pressure-sensitive adhesive, optical sensitive adhesive, or thermal-sensitive adhesive.

10. A curved capacitive touch panel, comprising: a three-dimensional curved flexible printed circuit board (FPCB) with at least one of capacitive touch sensing and detecting capability, wherein a first curved sidewall and a first curved endwall are respectively formed by compression molding along at least two axial directions; and
a touchable three-dimensional curved glass substrate comprising a second curved sidewall bonded with the first curved sidewall, and a second curved endwall bonded with the first curved endwall,
wherein the curved capacitive touch panel has a display area and at least one touch-sensing area, wherein the display area and the touch-sensing area are separately distributed on the area of the curved glass substrate, and
at least another touch-sensing area distributed on the first curved sidewall, second curved sidewall, the first curved endwall or the second curved endwall; and
wherein the curved capacitive touch panel performs as an outer case for containing an electronic device, and a display panel of the electronic device is aligned to the display area, wherein the touch position is detected when a touch on the touch panel touch-sensing area results in capacitance effect.

11. The curved capacitive touch panel of claim 10, wherein the compression molding is a heated compression molding or a vacuum-assisted cold pressing equipment.

12. The curved capacitive touch panel of claim 10, wherein the glass substrate comprises transparent glass.

13. The curved capacitive touch panel of claim 10, wherein the glass substrate comprises an inner curved surface, and wherein the curved FPCB comprises an outer curved surface, wherein the curved capacitive touch panel further comprises patterns, characters or symbols printed on the inner curved surface of the glass substrate for shielding corresponding portions of the curved FPCB.

14. Previously presented) The curved capacitive touch panel of claim 13, further comprising an adhesive layer coated between the inner curved surface of the glass substrate and the outer curved surface of the curved FPCB for facilitating attaching the outer curved surface of the curved FPCB to the inner curved surface of the substrate.

15. The curved capacitive touch panel of claim 13, wherein the inner curved surface of the glass substrate is an inner concave surface whereas the outer curved surface of the curved FPCB is an outer convex surface, wherein the inner concave surface of the glass substrate is bonded and attached to the outer convex surface of the curved FPCB.

16. The curved capacitive touch panel of claim 13, wherein the inner curved surface of the glass substrate is an inner convex surface whereas the outer curved surface of the curved FPCB is an outer concave surface, and wherein the inner convex surface of the glass substrate is bonded and attached to the outer concave surface of the curved FPCB.

17. The curved capacitive touch panel of claim 10, wherein the at least one touch-sensing area is used as a virtual key.

18. The curved capacitive touch panel of claim 10, wherein the curved glass substrate comprises a main portion, the second curved sidewall and the second curved endwall bent from the edges of the main portion, and wherein the main portion, the second curved sidewall and the second curved endwall define a receiving compartment for containing the electronic device, and wherein each of the main portion, the second curved sidewall and the second curved endwall has the touch-sensing area, and wherein the main portion has the display area.

* * * * *